United States Patent
Toyosawa (12) 
(10) Patent No.: US 6,337,257 B1
(45) Date of Patent: Jan. 8, 2002

(54) SEMICONDUCTOR DEVICE AND METHOD OF MANUFACTURING THE SAME

(75) Inventor: Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/499,028

(22) Filed: Feb. 7, 2000

(30) Foreign Application Priority Data

Feb. 9, 1999 (JP) .......................................... 11-030860
Jan. 24, 2000 (JP) .......................................... 12-014771

(51) Int. Cl.[7] .......................... H01L 21/30; H01L 21/46; H01L 21/302; H01L 21/461; H01L 21/495
(52) U.S. Cl. ...................... 438/459; 438/692; 438/928; 438/959; 438/977; 257/668
(58) Field of Search ................................. 438/977, 459, 438/692, 928, 959, 974, 115; 257/668

(56) References Cited

U.S. PATENT DOCUMENTS 5,434,433 A * 7/1995 Takasu et al. ................. 257/59
5,767,571 A * 6/1998 Kimura et al. ............... 257/668
5,811,877 A * 9/1998 Miyano et al. ............... 257/706
5,899,729 A * 5/1999 Lee .............................. 438/460
5,956,564 A * 9/1999 Newman et al. ............... 438/48

OTHER PUBLICATIONS

JP–B2 2665275 (JP–A 4–242945), Japan, Jun. 20, 1997 (First laid open on Aug. 31, 1992).

* cited by examiner

Primary Examiner—Richard Elms
Assistant Examiner—Adam Pyonin
(74) Attorney, Agent, or Firm—Nixon & Vanderhye P.C.

(57) ABSTRACT

Two contradictory problems of the reduction in the thickness of semiconductor chips or package parts including the semiconductor chips and the improvement in mechanical strength are solved. A semiconductor wafer where semiconductor elements are formed on a first surface thereof or semiconductor chips formed by dicing the semiconductor wafer are reduced in thickness by grinding the second surface opposite to the first surface, and grinding scratches formed by the grinding are removed to smooth the second surface. Since dicing scratches are formed on side surfaces of the semiconductor chips by dicing, the side surfaces are etched together with the second surface to remove the dicing scratches as well as the grinding scratches, thereby smoothing the second surface and the side surfaces.

13 Claims, 7 Drawing Sheets

53 SEMICONDUCTOR WAFER
58
34
60

SEMICONDUCTOR DEVICE AND METHOD OF MANUFACTURING THE SAME

BACKGROUND OF THE INVENTION

1. Field of the Invention

The present invention relates to a semiconductor device capable of being suitably used for a surface-mounted package such as a TCP (tape carrier package) where a semiconductor chip is mounted on a carrier tape, and a method of manufacturing the same.

2. Description of the Related Art

In recent years, with improving performance and decreasing size and weight of electronic apparatuses, LSI (large scale integration) packages are required to have more pins, finer pitches, smaller sizes and smaller thicknesses. As a semiconductor device highly likely to realize these requirements, a tape carrier package (abbreviated as TCP) which is a surface-mounted semiconductor device is frequently used. To further reduce the thickness of this semiconductor device, it is necessary to reduce the thickness of the semiconductor chip mounted on the chip substrate. Most semiconductor devices are used as liquid crystal driving circuits also called liquid panel drivers, and are directly connected to liquid crystal panels. By reducing the thickness of such semiconductor devices, the thickness of the liquid crystal panels on which the semiconductor devices are mounted can be reduced, and therefore, the liquid crystal panels being reduced in thickness are mounted. For example, the thickness of electronic apparatuses such as portable personal computers also called notebook computers and portable word processors can be also reduced.

In reducing the thickness of the semiconductor devices, for a semiconductor chip with a low aspect ratio between the chip length and the chip width where the chip width is not less than 1.5 mm and the chip length is not more than 16 mm, the semiconductor chip is ground until the thickness thereof becomes approximately 400 µm to manufacture a semiconductor device. In connection with grinding a semiconductor chip having such a low aspect ratio, in preprocessing for formation of the semiconductor chips from a semiconductor wafer on one surface of which are formed semiconductor elements, another surface of the wafer, opposite to the one surface, is ground to reduce the thickness of the wafer to approximately 400 µm, and thereafter using the semiconductor wafer having a thickness of approximately 400 µm, assembly is performed without applying any processing to the ground surface to manufacture the semiconductor device.

Figure 8:
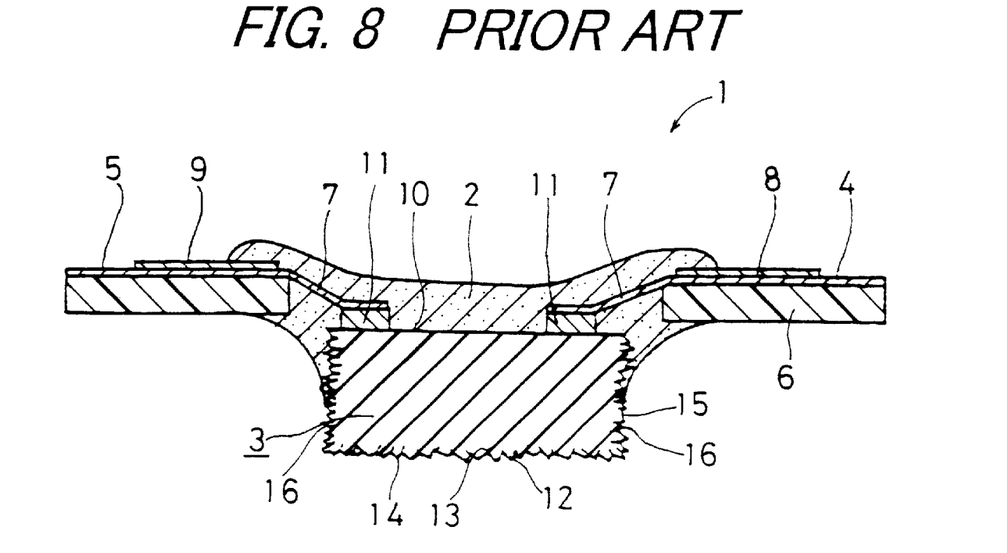
FIG. 8 is a cross-sectional view showing the typical prior art semiconductor device 1.

FIG. 8 is a cross-sectional view showing a typical prior art semiconductor device 1. In the above-described semiconductor device 1, no die pad is provided, but a semiconductor chip 3 elongated in a direction perpendicular to the plane of FIG. 8 is only covered with an encapsulating resin 2 and no mechanical reinforcement is provided. For this reason, the semiconductor chip 3 itself is responsible for the overall mechanical strength of the semiconductor device 1. Therefore, thickness reduction of the semiconductor chip 3 reduces the mechanical strength of the semiconductor device 1. The semiconductor device 1 tends to increase in the chip length in the direction of the length perpendicular to the plane of FIG. 8 like an SST (super slim TCP). The chip length is, for example, approximately 20 mm. The semiconductor chip 3 tends to decrease in the width in the horizontal direction of FIG. 8 conversely to the length thereof. The chip width is, for example, not more than 1 mm. Thus, the mechanical strength of the semiconductor chip 3 tends to decrease.

The semiconductor chip 3 has an input side wiring 4 and an output side wiring 5, and is connected to an inner lead 7 of a carrier tape 6 made of a polyimide base material by inner lead bonding (abbreviated as ILB). The input side wiring 4 and the output side wiring 5 are covered with solder resists 8 and 9. A bump 11 is formed at the terminal of a surface 10 of the semiconductor chip 3 where semiconductor elements are formed. An end of the inner lead 7 is connected to the bump 11. The semiconductor chip 3 has grinding scratches 14 including cracks 13 caused by grinding for flattening the semiconductor wafer, on another surface 12 opposite to the surface 10 where the semiconductor elements are formed, and has dicing scratches 16 of side surfaces 15 of the chip caused by dicing the semiconductor wafer.

When the width of the semiconductor chip 3 is not less than 1.5 mm where the mechanical strength of the semiconductor chip 3 is comparatively high, grinding of the surface 12 causes no problem of strength. However, when the width is approximately 1.0 mm, chip cracking occurs when the semiconductor device 1 is assembled and when the semiconductor device 1 is mounted on the mounting substrate of an electronic apparatus. With respect to such cracking of the chip of the semiconductor device 1, the inventor of this application has verified that in addition to the reduction in mechanical strength due to the insufficient cross section of the semiconductor chip 3 itself because of the grinding of the surface 12, the grinding scratches 14 caused by grinding and the dicing scratches 16 caused in the dicing process are main factors of the reduction in the mechanical strength of the semiconductor chip 3.

When the mechanical strength of the semiconductor chip 3 is low as described above, chip cracking occurs in the ILB process including a process in which an external force due to contact with another semiconductor chip acts on the semiconductor chip 3 in the assembling process, and in the marking process. Moreover, when the semiconductor device 1 is mounted on the mounting substrate, the semiconductor device 1 where the semiconductor chip 3 having been ground is mounted cracks with a slight external force, so that the electronic apparatus does not function.

Figure 9:
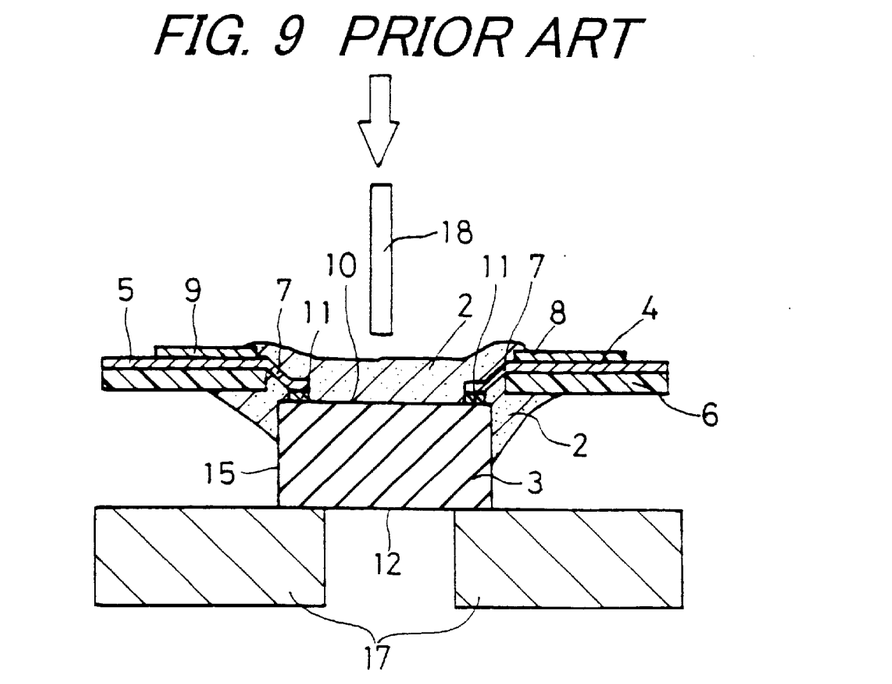
FIG. 9 is a cross-sectional view showing the structure for measuring the mechanical strength of the semiconductor device 1.

FIG. 9 is a cross-sectional view showing the structure for measuring the mechanical strength of the semiconductor device 1. In the measurement of the mechanical strength of the semiconductor chip 3, the semiconductor device 1 in which the semiconductor chip 3 was ground to a thickness of 400 µm and the grinding scratches 14 were formed on the surface 12 of the semiconductor chip 3 with a width of 1.2 mm in a direction (horizontal direction of FIG. 9) vertical to the direction of the chip length was fixed so that both ends in the direction of the width of the semiconductor chip 3 were supported by a stage 17, and the central part in the direction of the width of the semiconductor chip 3 was pressed by a jig 18 from above. The mechanical strength of the semiconductor chip 3 was only 1.47 N/cm (=150 gf/cm). The inventor of this application has verified that when 3σ is added, the semiconductor chip can crack with a pressure F=0N.

Figure 10A:
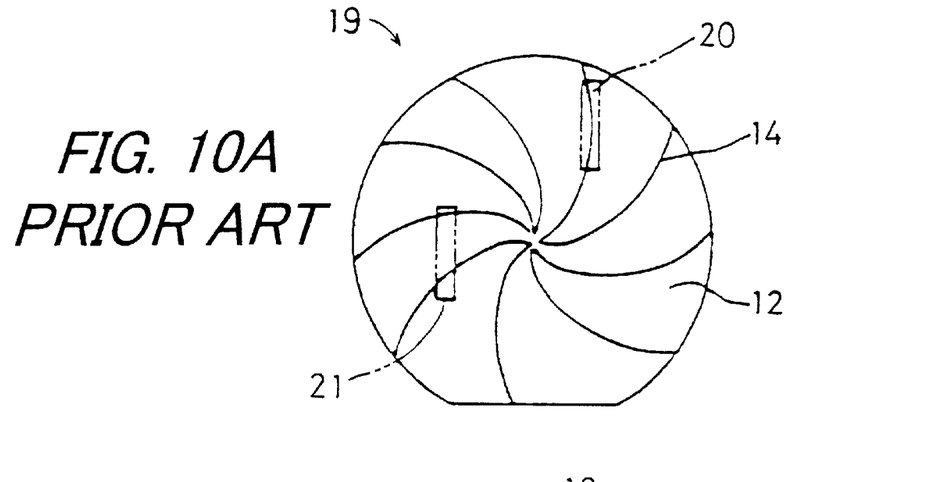
FIGS. 10A to 10C are views of assistance in explaining the difference in grinding scratches among the positions of cutting of the semiconductor chip 3 from the semiconductor wafer 19, FIG. 10A being a plan view showing the semiconductor wafer 19 having been surface-ground, FIG. 10B being a perspective view showing the grinding scratches 14a and the dicing scratches 16a when the semiconductor chip 3a cut from the first area 20 of the semiconductor wafer 19 is mounted on the chip substrate 6, and FIG. 10C being a perspective view showing the grinding scratches 14b and the dicing scratches 16b when the semiconductor chip 3b cut from the second area 21 of the semiconductor wafer 19 is mounted on the chip substrate 6.
Figure 10B:
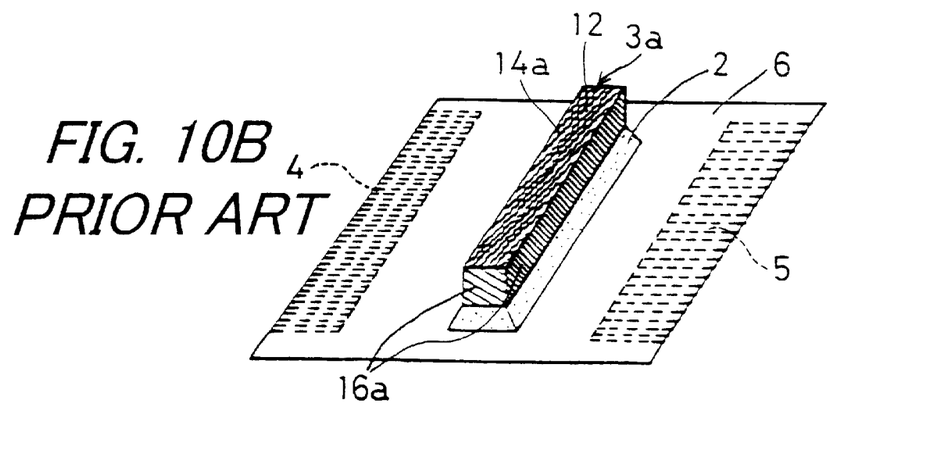
Figure 10C:
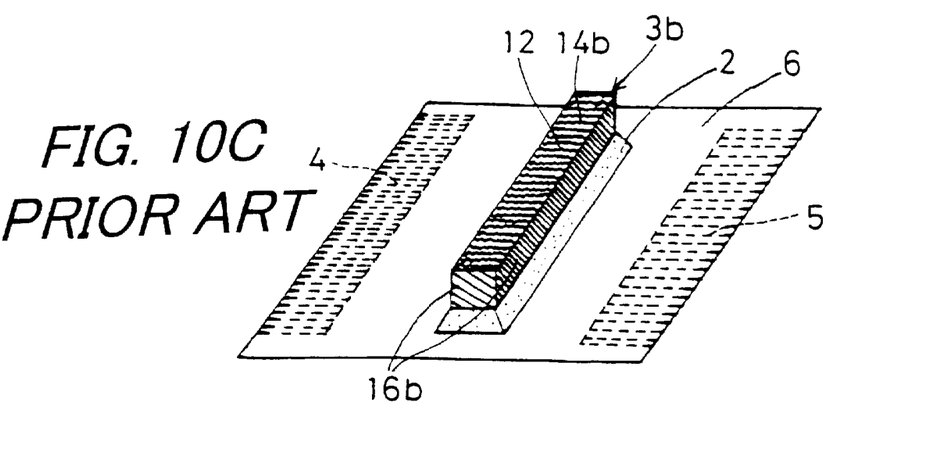

FIGS. 10A to 10C are views of assistance in explaining the difference in grinding scratches among the positions of cutting of the semiconductor chip 3 from a semiconductor wafer 19. FIG. 10A is a plan view showing the semiconductor wafer 19 having been surface-ground. FIG. 10B is a perspective view showing grinding scratches 14a and dicing scratches 16a when a semiconductor chip 3a cut from a first area 20 of the semiconductor wafer 19 is mounted on a chip substrate 6. FIG. 10C is a perspective view showing grinding scratches 14b and dicing scratches 16b when a semiconductor chip 3b cut from a second area 21 of the semiconductor wafer 19 is mounted on the chip substrate 6.

The grinding scratches 14 formed after the grinding of the surface 12 of the semiconductor wafer 19 are spiral as shown in FIG. 10A, and the direction of the grinding scratches 14 formed on the surface 12 of the semiconductor chip 3 differs according to the cutting position on the semiconductor wafer 19. When the semiconductor chip 3a cut by dicing from the first area, represented by reference numeral 20, of the semiconductor wafer 19 shown in FIG. 10A is assembled on the chip substrate 6 without any processing being performed after the surface grinding, as shown in FIG. 10B, the grinding scratches 14a are formed on the surface 12 of the semiconductor chip 3a in a direction substantially parallel to the direction of the length of the semiconductor chip 3a.

When the semiconductor chip 3b cut by dicing from the second area, represented by reference numeral 21, of the semiconductor wafer 19 shown in FIG. 10A is assembled on the chip substrate 6 without any processing being performed after the surface grinding, as shown in FIG. 10C, the grinding scratches 14b are formed on the surface 12 of the semiconductor chip 3b in a direction substantially perpendicular to the direction of the length of the semiconductor chip 3b.

The inventor of this application has verified that the grinding scratches 14b formed in the direction substantially perpendicular to the direction of the length of the semiconductor chip 3b as shown in FIG. 10C particularly significantly reduces the mechanical strength of the semiconductor chip 3b. The grinding scratches 14a formed in the direction substantially parallel to the direction of the length of the semiconductor chip 3a as shown in FIG. 10B does not significantly reduce the mechanical strength of the semiconductor chip 3a.

As described above, factors responsible for the reduction in the mechanical strength of the semiconductor chip 3 are the grinding scratches 14 and the dicing scratches 16, and it has been found that the cracks 13 caused in grooves between scratches are a significant cause.

As described above, although the prior art is effective in reducing the thickness of the semiconductor device 1 by the grinding of the semiconductor chip 3 to thereby reduce the thickness of the liquid crystal panel using the semiconductor device 1, the mechanical strength of the semiconductor device 1 is reduced. For this reason, in mounting the semiconductor device 1 on various electronic apparatuses such as a liquid crystal panel, handling is extremely difficult because of action of an external impactive force at the time of conveyance and supply of the semiconductor device 1 and the generation of internal stress at the time of mounting onto the substrate, and it is desired to solve such a problem.

SUMMARY OF THE INVENTION

An object of the invention is to provide a semiconductor device having a semiconductor chip or semiconductor-chip-carrying package part which is reduced in thickness and increased in mechanical strength, and a method of manufacturing the same.

The invention provides a semiconductor device comprising a semiconductor substrate including a semiconductor element formed on a first surface thereof, wherein the semiconductor substrate is reduced in thickness by grinding a second surface thereof, opposite to the first surface, grinding scratches of the second surface caused by the grinding are removed to smooth the second surface of the semiconductor substrate.

The invention provides a method of manufacturing a semiconductor device comprising a semiconductor substrate including a semiconductor element formed on a first surface thereof, comprising the steps of grinding a second surface of the semiconductor substrate, opposite to the first surface, to reduce the semiconductor substrate in thickness; and removing grinding scratches of the second surface caused by the grinding to smooth the second surface of the semiconductor substrate.

According to the invention, by removing the grinding scratches on the second surface of the semiconductor substrate which is a semiconductor wafer or semiconductor chip having a semiconductor element on the first surface thereof, which element is formed through a diffusing process or the like, the semiconductor substrate is reduced in thickness and increased in mechanical strength, with the result that cracking does not occur even when an external force acts on the semiconductor substrate. The semiconductor substrate may be either a semiconductor wafer or a semiconductor chip obtained by dicing the semiconductor wafer. By using a semiconductor substrate simultaneously solving two contradictory problems of the reduction in thickness and the enhancement in mechanical strength, a package part reduced in thickness and enhanced in mechanical strength can be obtained as an end product.

In the invention it is preferable that the grinding scratches caused by the grinding of the second surface are removed by at least any one of etching, melting and chemical mechanical polish (CMP) surface treatment processes.

According to the invention, by using one or more of relatively frequently used known surface treatment technologies such as etching, melting and CMP, the second surface of the semiconductor substrate can be easily and stably smoothed.

In the invention it is preferable that the semiconductor substrate having the smoothed second surface has a thickness of 40 to 400 $\mu$m.

According to the invention, the thickness of the semiconductor substrate having the smoothed second surface is selected to be 40 to 400 $\mu$m, which is a significantly reduced thickness compared to an original thickness of the semiconductor substrate without deteriorating the mechanical strength required of a package part carrying a semiconductor chip comprising the semiconductor substrate.

In the invention it is preferable that the semiconductor substrate is a semiconductor chip which is formed by dicing, and side surfaces of the semiconductor chip are smoothed by removing dicing scratches formed thereon by the dicing.

According to the invention, since not only the grinding scratches on the second surface of the semiconductor substrate but also the dicing scratches on the side surfaces thereof are removed, the mechanical strength can be enhanced with higher reliability than in the case where only the grinding scratches are removed.

In the invention it is preferable that a terminal of the semiconductor element is connected to a wiring formed on a carrier tape by inner lead bonding.

According to the invention, since the semiconductor chip where the grinding scratches on the second surface are removed or the dicing scratches on the side surfaces are additionally removed is connected to the carrier tape by inner lead bonding, no crack due to a mechanical external force occurs in the semiconductor chip at the time of inner lead bonding. This improves the yield, so that a thinner package part with high reliability can be obtained.

In the invention it is preferable that the semiconductor chip is bonded to the carrier tape by encapsulation with resin.

According to the invention, by bonding the semiconductor chip to the carrier tape by encapsulation with resin, the moisture resistance between the semiconductor chip and the carrier tape is improved and the impact resistance is improved, so that the mechanical strength can be further enhanced.

In the invention it is preferable that the semiconductor element is a liquid crystal driving circuit.

In the method of manufacturing a semiconductor device of the invention it is preferable that in the case where the grinding scratches are removed by a etching surface treatment process, a depth of etching is selected to be not less than 3 μm and not more than 50 μm.

According to the invention, since the depth of etching of the second surface of the semiconductor wafer or the semiconductor chip is selected to be not less than 3 μm and not more than 50 μm, the grinding scratches on the second surface can be removed with reliability without the mechanical strength being reduced more than necessary.

In the method of manufacturing a semiconductor device it is preferable that in the case where an etching surface treatment process is selected to remove the grinding scratches, an etchant is supplied to the second surface by spraying.

According to the invention, since the etchant is supplied by spraying to the second surface of the semiconductor chip having not been etched yet, only a part of the semiconductor chip that requires etching can be removed by the etching surface treatment process with reliability without the need for much etchant compared to a case where the semiconductor chip is soaked, so that the cost can be reduced.

In the method of manufacturing a semiconductor device it is preferable that in the case where a melting surface treatment process is selected to remove the grinding scratches, a depth of melting is selected to be not less than 3 μm and not more than 15 μm.

According to the invention, since the depth of melting of the semiconductor chip is selected to be not less than 3 μm and not more than 15 μm, the grinding scratches of the semiconductor chip can be removed with higher reliability.

The invention provides a method of manufacturing a semiconductor device comprising a semiconductor wafer including semiconductor elements formed on a first surface thereof, comprising the steps of grinding a second surface opposite to the first surface to reduce the semiconductor wafer to a predetermined thickness, thereafter coating the first surface with a protective film which is resistant to an etchant for use in first and second etching surface treatment processes to be performed later, removing grinding scratches caused by the grinding by the first etching, covering the second surface of the semiconductor wafer the first surface of which is coated with the protective film, with a dicing tape which is resistant to the etchant, to dice the semiconductor wafer, and thereafter removing dicing scratches caused by the dicing, by the second etching surface treatment process.

According to the invention, since the dicing scratches can be removed by etching after the grinding scratches on the second surface of the semiconductor wafer are removed by etching, a semiconductor chip can be obtained in which the second surface and the side surfaces are smoothed without damaging the semiconductor element formed on the first surface of the semiconductor wafer or the semiconductor chip.

The invention provides a method of manufacturing a semiconductor device comprising the steps of bonding a protective tape which is resistant to an etchant, directly or with a resist in between, to a first surface of a semiconductor wafer on which surface semiconductor elements are formed; grinding a second surface of the semiconductor wafer to drop the semiconductor wafer to a predetermined thickness; and removing grinding scratches caused by the grinding, by etching.

According to the invention, even when the second surface is ground in the state of the semiconductor wafer, since the semiconductor element formed on the first surface of the semiconductor wafer is covered with the protective tape, the etchant is prevented from adhering to the semiconductor element exposed out of the surface, so that the semiconductor element can be protected.

The invention provides a method of manufacturing a semiconductor device comprising the steps of dicing a semiconductor wafer including semiconductor elements formed on a first surface thereof so as to be separated into a plurality of elongated semiconductor chips; and grinding a second surface of the semiconductor wafer separated into the semiconductor chips to thereby reduce the semiconductor chips in thickness, wherein the grinding is performed in a direction substantially parallel to a longitudinal direction of each semiconductor chip; and removing grinding scratches of the second surface caused by the grinding to smooth the second surface.

According to the invention, since the grinding is carried out along the longer side of each semiconductor chip, the grinding scratches can be formed substantially parallel to the direction of the longer side of each semiconductor chip, with the result that all the semiconductor chips have a uniform mechanical strength for cracking. Consequently, more stable crack strength distribution can be obtained. Since the mechanical strength for cracking can be significantly enhanced compared to a case where the grinding scratches are formed substantially parallel to the direction of the shorter side of each semiconductor chip, the reliability and the yield can be improved.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Now referring to the drawings, preferred embodiments of the invention are described below.

Figure 1:
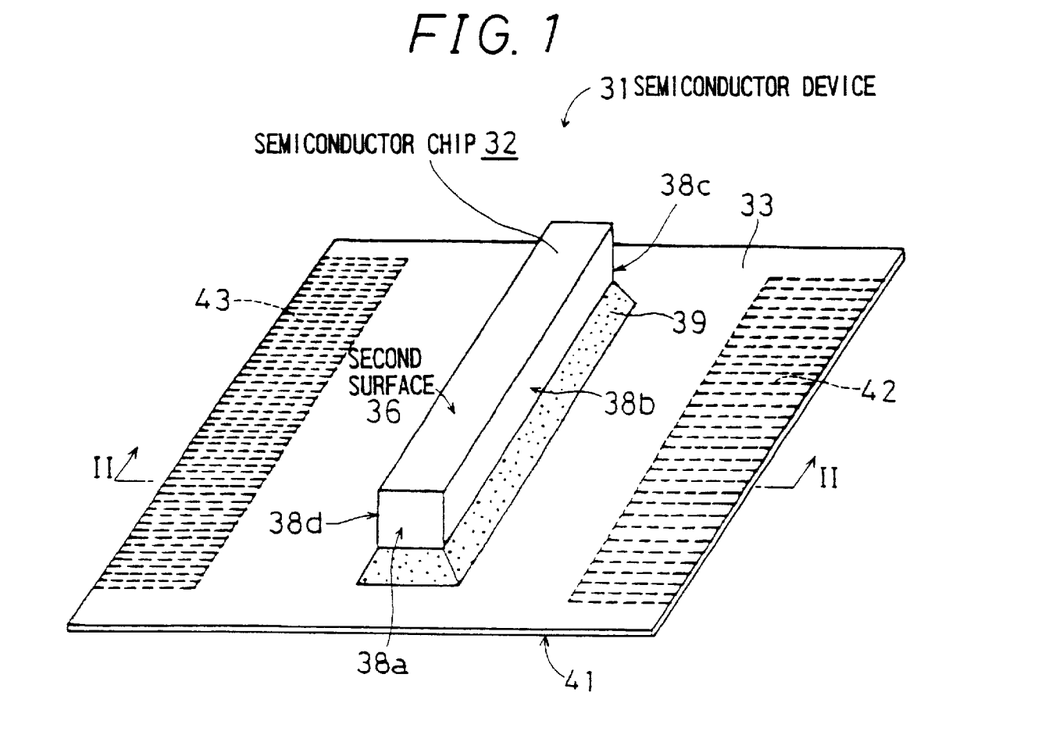
FIG. 1 is a perspective view showing a semiconductor device 31 according to an embodiment of the invention.
Figure 2:
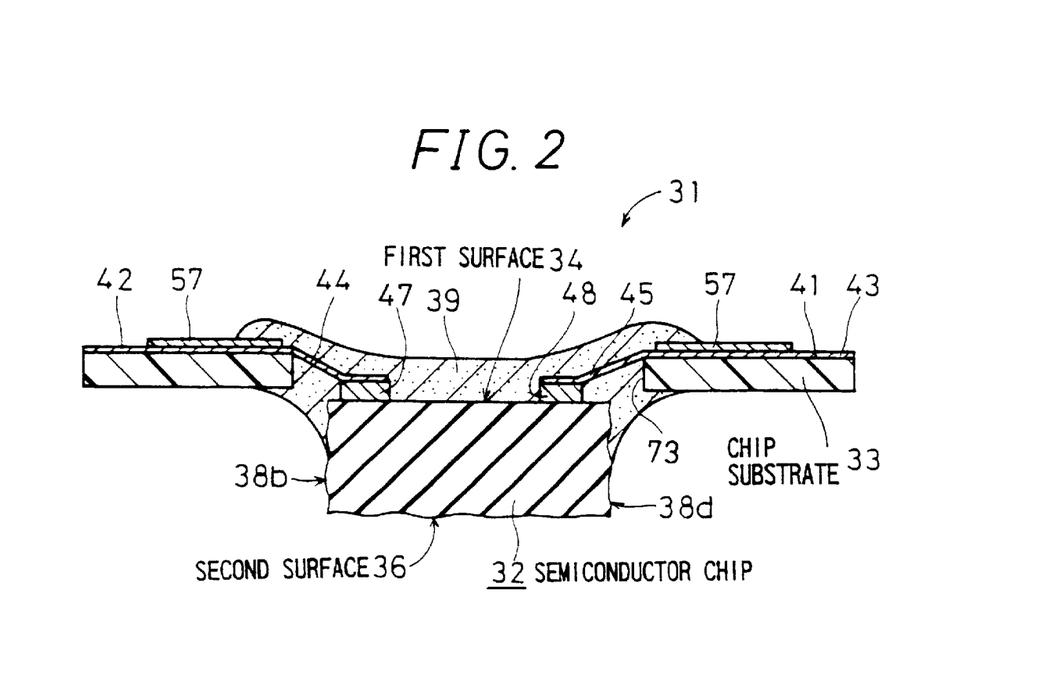
FIG. 2 is an enlarged cross-sectional view, taken on the line II—II of FIG. 1, showing the semiconductor device 31 upside down.

FIG. 1 is a perspective view showing a semiconductor device 31 according to an embodiment of the invention. FIG. 2 is an enlarged cross-sectional view, taken on the line II—II of FIG. 1, showing the semiconductor device 31 upside down. The semiconductor device 31 of this embodiment includes a semiconductor chip 32 and a chip substrate 33 where the semiconductor chip 32 is mounted. The semiconductor chip 32 has a first surface 34 where a plurality of semiconductor elements are formed, a second surface 36 opposite to the first surface 34 in the direction of the thickness of the semiconductor chip 32 (the vertical direction of FIG. 2) and made smooth by removing subsequently-described grinding scratches 35 by etching, and four side surfaces 38a to 38d (when generically called, the affixes a to d are omitted) made smooth by removing subsequently-described dicing scratches 37a to 37d (when generically called, the affixes a to d are omitted) by etching. The external shape of the semiconductor chip 32 is a rectangular pole elongated in a direction perpendicular to the plane of FIG. 2.

The semiconductor chip 32 is bonded to the sheet-form chip substrate 33 with an encapsulating resin 39. The chip substrate 33 is formed, for example, by die-cutting an execution pattern area of an elongated carrier tape comprising a polyimide film with a width of 35 mm. On one surface 41 of the chip substrate 33, a plurality of input side and output side wirings 42 and 43 are formed. The input side wirings 42 and the output side wirings 43 comprise a plurality of inner leads 44 and 45 protruding from both sides into a device hole 73 provided substantially in the center of the chip substrate 33 which inner leads 44 and 45 are integrally collected. The ends of the inner leads 44 and 45 protruding into the hole 73 are connected to the terminal or the electrode of the semiconductor element through bumps 47 and 48 formed on the first surface 34 of the semiconductor chip 32.

Figure 3A:
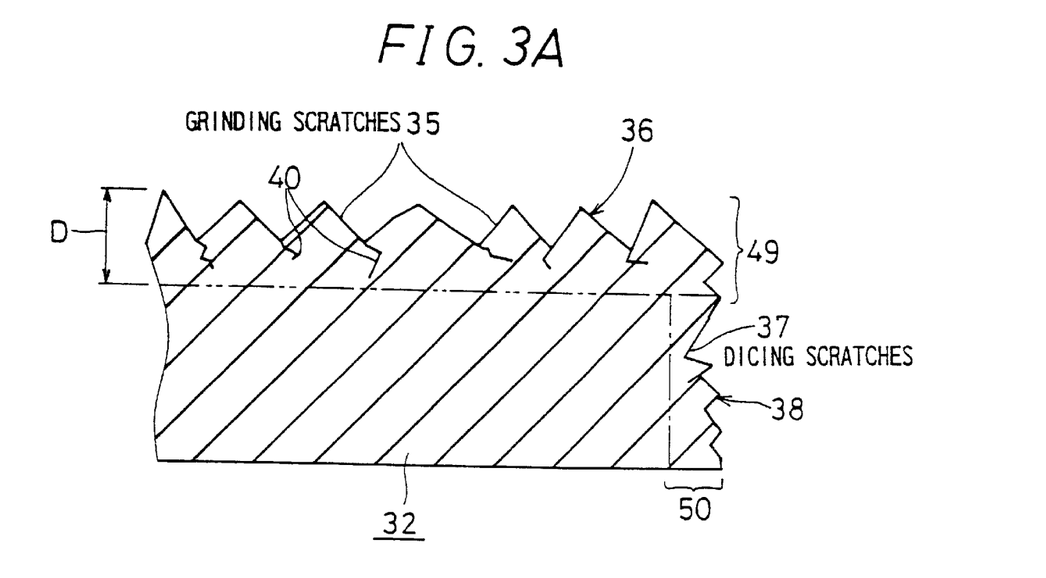
FIGS. 3A and 3B are enlarged partial cross-sectional views of assistance in explaining the condition of the second surface 36 of a semiconductor chip 32, FIG. 3A showing the condition of the second surface 36 before etching, FIG. 3B showing the condition of the second surface 36 after etching.
Figure 3B:
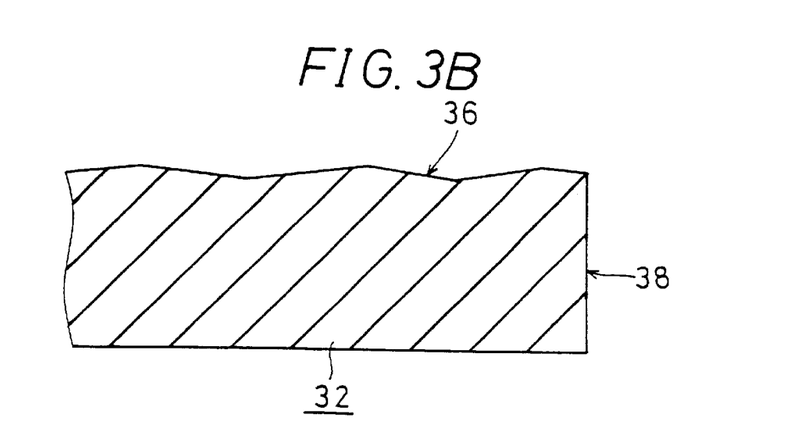

FIGS. 3A and 3B are enlarged partial cross-sectional view of assistance in explaining the condition of the second surface 36 of the semiconductor chip 32. FIG. 3A shows the condition of the second surface 36 before etching. FIG. 3B shows the condition of the second surface 36 after etching. To form the semiconductor chips 32, the second surface 36 of a semiconductor wafer where semiconductor elements are formed on the first surface 34 through a diffusing process or the like is ground for smoothing and the semiconductor wafer having been ground is cut along grid scribe streaks with an extremely thin rotary circular saw called a dicing saw. Therefore, on the semiconductor chips 32 obtained by dicing, a multiplicity of grinding scratches 35 remain on the second surface 36 and the dicing scratches 37 remain on the side surfaces 38 as shown in FIG. 3A. By removing the grinding scratches 35 and the dicing scratches 37, that is, by removing an area 49 where the grinding scratches 35 are formed and an area 50 where the dicing scratches 37 are formed as shown in FIG. 3B, the mechanical strength of the semiconductor chip 32 can be improved.

Methods of removing the grinding scratches 35 include a method using wet etching in which the semiconductor chip 32 is soaked in an etchant, a method in which the area 49 of the semiconductor chip 32 where the grinding scratches 35 are formed is melted with a laser, and a method using dry etching in which the area 49 where the grinding scratches 35 are formed is etched with plasma. Since most of the cracks of the grinding scratches 35 are approximately 3 μm in length, it is necessary that a removal depth D be not less than 3 μm in order to remove the area 49 where the grinding scratches 35 are formed. In the case of etching, the removal depth D is $$3\ \mu m < D \leq 50\ \mu m \tag{1}$$

In the case of melting, $$3\ \mu m < D \leq 15\ \mu m \tag{2}$$

In the case of etching, when the removal depth D exceeds 50 μm (D>50 μm), nonuniformness in the thickness of the semiconductor wafer increases. In the case of melting, when the removal depth D exceeds 15 μm (D>15 μm), the entire semiconductor wafer is heated, so that a problem arises such that the semiconductor element breaks due to the heat. Therefore, the depth D to which the grinding scratches 35 are removed is selected as shown by the expressions (1) and (2).

As described above, in this embodiment, by smoothing the grinding scratches 35 after the semiconductor chip 32 is reduced in thickness by grinding, the mechanical strength, specifically crack strength, of the semiconductor device 31 is improved. For the smoothing, one of etching, melting and CMP or a combination of some of these processings can be used. By the smoothing, the grinding scratches 35 and cracks 40 coming with the grinding scratches 35 can be removed from the second surface 36, so that the reduction in thickness and the maintenance or the improvement in mechanical strength which are contradictory to each other can be simultaneously achieved.

When plasma etching is performed as the etching, semiconductor wafers are placed in a vacuum chamber one by one and mounted on a wafer holder placed in parallel so as to be opposed to an upper electrode being grounded, and a bias high-frequency voltage is applied to the wafer holder to transform the etching gas into plasma, whereby the second surface 36 can be etched. For the plasma etching, a known dry etching technology used, for example, for etching of aluminum wiring, using, for example, $Cl_2$—$BCl_3$ as the etching gas and forming $AlCl_3$ as the reaction product is applied.

After the etching, as shown in FIGS. 1, 2 and 3B, the second surface 36 becomes mirror-smooth and there are hardly any pits and projections left. It is desirable to remove both the grinding scratches 35 and the dicing scratches 37. When this is done, the mechanical strength of the semiconductor chip 32 exceeds 9.8 N/cm (=1 kgf/cm). When only one of the grinding scratches 35 and the dicing scratches 37 is removed by etching, the mechanical strength of the semiconductor chip 32 is 4.41 N/cm (=450 gf/cm).

Moreover, in this embodiment, cases will be described where the semiconductor chip 32 with a thickness of 625 μm and a semiconductor wafer having not been diced yet are ground to a thickness of 400 μm. For example, when the semiconductor chip 32 is ground, first, the semiconductor chip 32 is ground by 200 μm by a grinder with a grindstone of approximately JIS No. 120, and then, ground by approximately 25 μm with a No. 2000 grindstone while the grindstone is being rotated. When the semiconductor wafer was ground, a 6-inch grindstone was used, and as the semiconductor chip 32, a 1.1×18-mm chip (the aspect ratio is 16.4) was used. The above-mentioned sizes of the semiconductor chip 32 and the semiconductor wafer and the kinds of the grindstones are only examples and the invention is not limited to these sizes and kinds.

(First Embodiment)

Figure 4:
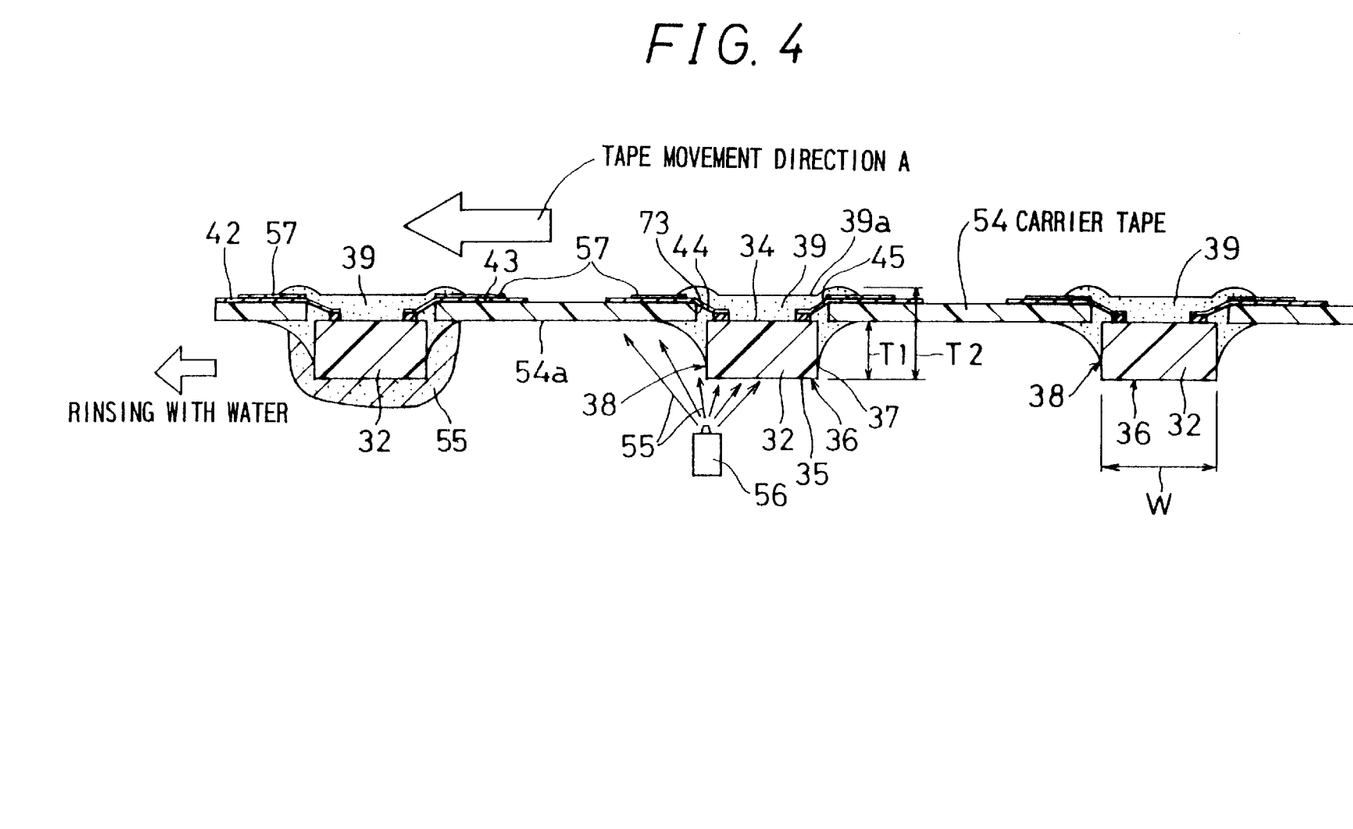
FIG. 4 is a view of assistance in explaining a method of performing grinding under a condition where a plurality of semiconductor chips 32 are mounted on an elongated carrier tape 54.

FIG. 4 is a view of assistance in explaining a method of performing grinding under a condition where a plurality of semiconductor chips 32 are mounted on an elongated carrier tape 54. A semiconductor wafer where semiconductor elements are formed is bonded to a dicing sheet and diced as described previously, thereby forming the semiconductor chips 32. After the semiconductor chips 32 and the carrier tape 54 are bonded by ILB and encapsulated with a liquid encapsulating resin 39, marking is performed on the resin surface 39a. The processes succeeding the ILB are all performed with the carrier tape 54 being wound around the reel.

Since the processing is performed with approximately 40 meters of the carrier tape 54 being wound around the reel, in the case of 3-pitch semiconductor devices 31 as shown in FIG. 4, approximately 2800 semiconductor devices 31 are present on one reel. Then, the semiconductor chips 32 are supplied to the grinder with the rear surface 54a of the carrier tape 54 facing upward under the condition where the carrier tape 54 is wound around the reel. The grinder is designed so that one to three semiconductor chips 32 can be simultaneously ground. The carrier tape 54 is fixed by dampers at portions where no semiconductor chips 32 are present. Under this condition, the semiconductor chips 32 are ground to a predetermined thickness while water is poured thereover.

The overall thickness T2 of the semiconductor devices 31 where the semiconductor chips 32 whose thickness T1 before grinding is 625 μm are mounted is approximately 900 μm. In this case, since semiconductor chips whose rear surfaces are not ground like the prior art are handled in the ILB, the encapsulation and the marking included in the assembling process of the semiconductor devices 31, troubles such as chip cracking in the assembling process are not caused. The thickness T1 of the semiconductor chips 32 can be freely reduced to a desired thickness by grinding. The inventor of this application has verified that even when the semiconductor chips 32 are ground from the side of the second surface 36 until the thickness T1 becomes, for example, 200 μm, problems such as cracking never arise. At this time, the overall thickness T2 of the semiconductor devices 31 is 420 μm.

As mentioned previously in association with the prior art, since special care must be taken in handling when the semiconductor chips 32 are mounted on the semiconductor devices 31, the grinding scratches 35 and the dicing scratches 37 are removed by etching before the semiconductor devices 31 are mounted, for example, on liquid crystal panels. In this case, when the base material of the semiconductor chips 32 is polycrystalline silicon, the semiconductor devices 31 are not soaked in a hydrofluoric acid-nitric acid (HF—HNO$_3$) etchant as they are, but as shown in FIG. 4, the carrier tape 54 is conveyed in the direction of the arrow A so as to be substantially horizontally stretched with the second surfaces 36 of the semiconductor chip 32 facing downward, and from therebelow, an etchant 55 is sprayed from a nozzle 56.

By preventing the etchant 55 from adhering to a solder resist 57 formed on the carrier tape 54 by spraying the etchant 55 toward the semiconductor chips 32 from below, the solder resist 57 having low resistance to strong acids is protected from the strongly acid etchant 55 and the etchant 55 is caused to uniformly adhere to the second surfaces 36 of the semiconductor chips 32 and the side surfaces 38 exposed out of the encapsulating resin 39, whereby etching can be isotropically performed.

To etch the semiconductor chips 32, as described previously, the etching depth D is set to approximately 3 μm, and the second surfaces 36 and the side surfaces 38 exposed out of the encapsulating resin 39 are etched. At this time, the etching time is five to six seconds. After the etching is finished, the semiconductor chips 32 are immediately rinsed with water to wash the etchant 55 away and are dried with dry air of approximately room temperature. The areas 49 of the semiconductor chips 32 where the grinding scratches 35 are formed and the areas 50 where the dicing scratches 37 are formed are thus removed and the second surfaces 36 of the semiconductor chips 32 and the parts of the side surfaces 38 exposed out of the encapsulating resin 39 are smoothed, whereby semiconductor chips 32, consequently semiconductor devices 31, having an improved mechanical strength can be obtained.

In this embodiment, although the grinding scratches 35 on the second surfaces 36 of the semiconductor chips 32 can be completely removed, the dicing scratches 37 formed on the side surfaces 38 of the semiconductor chips 32 remain on the part covered with the encapsulating resin 39. However, since the encapsulating resin 39 intrudes into the dicing scratches on the covered part and is hardened, it is considered that a load due to an external mechanical force scatters also over the encapsulating resin 39. The inventor of this application examined the mechanical strength of a semiconductor chip 32 with a thickness T1 of 400 μm and a width W of 1.2 mm, and the mechanical strength extremely significantly improved and exceeded 9.8 N/cm. It was verified that even when an external force acted on the semiconductor chip 32, the semiconductor chip 32 warped and was therefore extremely resistant to cracking.

In another embodiment of the invention, instead of spraying the etchant 55, etching may be performed by a dipping method in which only the second surface 36 sides of the semiconductor chips 32 are soaked in the etchant 55 in a non-illustrated depot. In this case, since the solder resist 57 formed on the carrier tape 54 has a comparatively low degree of tolerance for strong acids, it is desirable to avoid soaking of the solder resist 57 as much as possible.

In still another embodiment of the invention, the following may be performed: A semiconductor wafer having been ground is diced into a plurality of semiconductor chips 32, the semiconductor chips 32 are mounted on the elongated carrier tape 54 and encapsulated in resin, and the carrier tape 54 is die-cut into a necessary external size for each semiconductor chip 32 to form semiconductor devices 31. Then, etching is performed following a similar procedure to that described above to remove the grinding scratches 35 on the second surfaces 36 of the semiconductor chips 32 and the dicing scratches 37 on the side surfaces 38 exposed out of the encapsulating resin 39.

(Second Embodiment)

Subsequently, the following methods will be described: a method in which a semiconductor wafer is ground and after the grinding scratches 35 are removed by etching, dicing is performed and the dicing scratches 37 on the side surfaces 38 are removed by etching; and a method in which etching is not performed after a semiconductor wafer is ground, but after dicing, the semiconductor chips 32 are moved onto another protective tape, and after the grinding scratches 35 and the dicing scratches 37 are removed, the semiconductor chips 32 are moved onto the dicing tape.

After an acid-proof protective tape was bonded to the first surface 34, where semiconductor elements were formed, of a semiconductor wafer which was a semiconductor substrate, the rear surface was ground by 400 µm, and after the rear surface was ground, the semiconductor wafer was soaked in the HF—HNO$_3$ etchant to etch the second surface 36 by not less than 3 µm, thereby removing the grinding scratches 35. The protective tape prevents the etchant from reaching the first surface 34.

In this embodiment, etching was performed so that the etching amount was 10 µm. Measuring the mechanical strength of the semiconductor chips 32 after the dicing, the mechanical strength improved to 4.41 N/cm (=450 gf/cm) even in the case of the semiconductor chips 32 where the grinding scratches 35 are formed in a direction perpendicular to the direction of the length of the semiconductor chips 32.

After the grinding scratches 35 are removed by etching, the protective tape is removed and dicing is performed. Dicing tape is bonded to the second surface 36 of the semiconductor wafer having been etched, and a dicing saw is rotated to cut the semiconductor wafer in to chip pieces. On the semiconductor chips 32 formed by the cutting, the dicing scratches 37 are formed due to the dicing.

Then, the scratches on the peripheries of the semiconductor chips 32 formed due to the dicing are removed by soaking in an etchant like the grinding scratches 35 on the second surface 36. That is, after the dicing is performed, with the dicing tape being bonded, another protective tape is bonded to the second surface 36 of the semiconductor wafer, and the semiconductor chips 32 are soaked in the HF—HNO$_3$ etchant for approximately one minute. While the semiconductor chips 32 are being soaked, the HF—HNO$_3$ etchant is agitated in order to prevent etching unevenness. Since the liquid temperature increases due to the etching reaction heat during the etching, the liquid temperature is controlled so as to be between 25 to 30° C.

In this embodiment, etching was performed with a 4-liter HF—HNO$_3$ etchant being in an etching bath for one semiconductor chip 32. When a multiplicity of semiconductor chips 32 are processed, by changing the etchant, for example, every time 25 semiconductor chips are processed, the etching amount is prevented from deteriorating so that stable etching can be performed. The amount of the etchant and the number of semiconductor chips can be appropriately changed by performing circulating filtering or the like.

In this embodiment, one is effective where an Au bump is formed on a pad portion of the first surface 34 of the semiconductor chip and an SiN passivation film is formed on the surface of the semiconductor chip. When an SiO film is used as the passivation film, the HF—HNO$_3$ etchant melts the SiO passivation film.

Figure 5A:
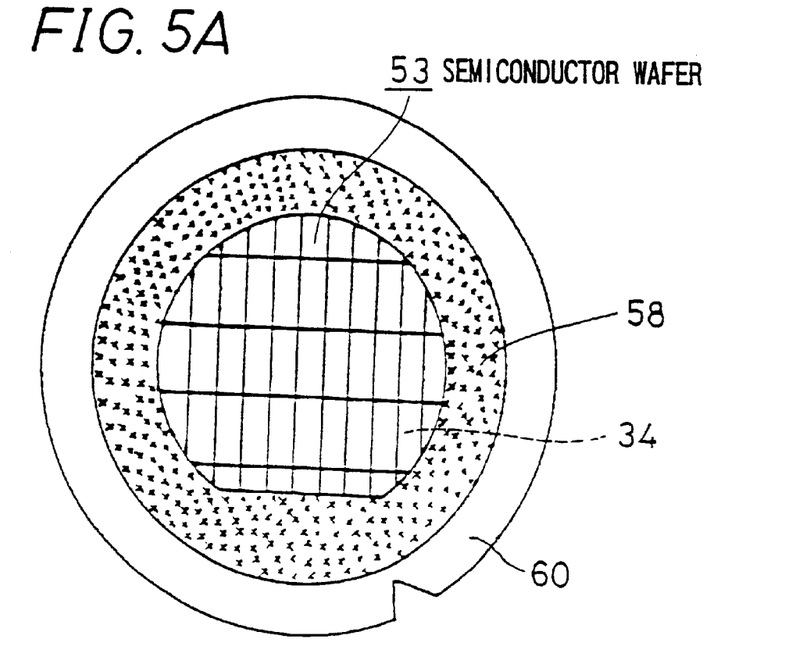
FIGS. 5A and 5B are views of assistance in explaining a semiconductor device manufacturing method according to another embodiment, FIG. 5A showing the condition after dicing is performed without the above-described etching being performed after the second surface 36 of a semiconductor wafer is ground, FIG. 5B showing the condition after the semiconductor chips 32 after dicing shown in FIG. 5A are moved onto another protective tape 59 so that first surfaces 34 are in contact with the protective tape 59.
Figure 5B:
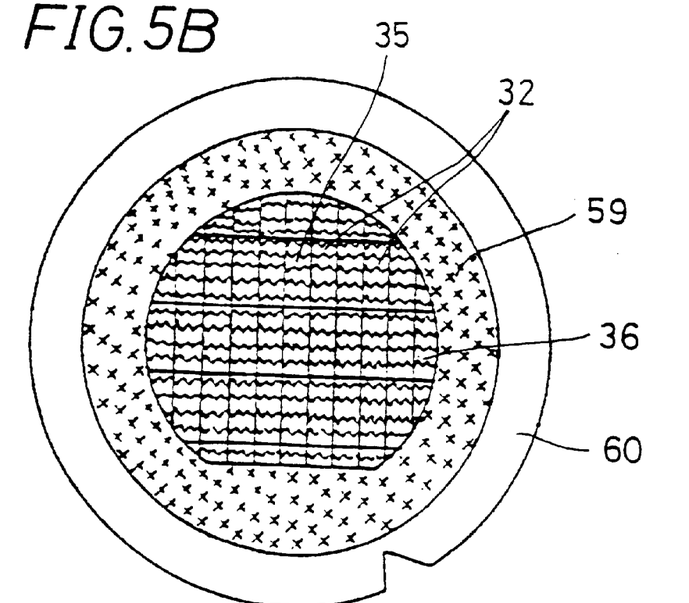

FIGS. 5A to 5B are views of assistance in explaining a semiconductor device manufacturing method according to another embodiment. FIG. 5A shows the condition after dicing is performed without the above-described etching being performed after the second surface 36 of a semiconductor wafer 53 is ground. FIG. 5B shows the condition after the semiconductor chips 32 after dicing shown in FIG. 5A are moved onto another protective tape 59 so that the surfaces 34 are in contact with the protective tape 59. As shown in FIG. 5A, a circular dicing frame 60 is fitted around the semiconductor wafer 53 before dicing, and with a dicing tape 58 being bonded to the first surface 34, the semiconductor wafer 53 is diced along grid scribe streaks to be separated into a plurality of semiconductor chips 32.

The semiconductor chips 32 thus obtained are moved onto another protective tape 59 while being in intimate contact with the dicing tape 58 as shown in FIG. 5B, and are soaked in the etchant, thereby simultaneously removing the grinding scratches 35 on the second surfaces 36 of the semiconductor chips 32 and the dicing scratches 37 on the peripheries of the semiconductor chips 32. Then, the semiconductor chips 32 are rinsed with pure water for ten minutes and dried. Then, the semiconductor chips 32 are again moved as they are so that the second surfaces 36 of the semiconductor chips 32 are in contact with still another protective tape (not shown). Then, the ILB process included in the assembling process is performed.

It was verified that the semiconductor chips 32 thus etched have an extremely high mechanical strength exceeding 9.8 N/cm (=1 kgf/cm) because the grinding scratches 35 and the dicing scratches 37 are removed, and are extremely resistant to cracking because the semiconductor chips 32 warp when an external force is exerted.

(Third Embodiment)

Subsequently, a case will be described where the grinding and the etching of the semiconductor wafer are performed with the protective tape being bonded to the surface. First, a resist liquid being resistant to the etchant is previously applied to the first surface 34 of the semiconductor wafer to a thickness of approximately 20 µm by spin coating and hardened. As the resist liquid, for example, . . . is used. Then, a first protective tape is bonded over the hardened resist film. The thickness of the first protective tape is 130 to 150 µm. An adhesive is applied to the first protective tape, and by the adhesive, the protective tape is bonded to the resist film formed on the first surface 34 of the semiconductor wafer. The resist film prevents the first surface 34 of the semiconductor wafer from being impregnated with the etchant in etching performed later, and absorbs pits and projections when there are bumps on the first surface 34.

Then, after the second surface 36 of the semiconductor wafer is ground, the first protective tape is removed, and then, a second protective tape being resistant to strong acids is bonded onto the first surface 34. This is because the etchant is strongly acid. When an acid-proof tape is used as the first protective tape at the time of grinding, it is unnecessary to use different protective tapes in grinding and in etching. When an acid-proof protective tape is used, since two processes of grinding the second surface 36 and etching can be performed with the same protective tape being bonded, the time required for the processes can be reduced and the protective tape material can be saved. The protective tape may be directly bonded to the first surface 34 of the semiconductor wafer 53 with no resist film in between unlike the above-described structure.

Then, the semiconductor wafer 53 where the protective tape is bonded to the first surface 34 as described above is soaked in the HF—HNO$_3$ etchant for two minutes, and rinsed with water for twenty minutes. After the rinsing, the semiconductor wafer 53 is dried, the protective tape is removed, and a resist melting liquid is applied to the resist film so that the resist film is removed by being melted. Then, the semiconductor wafer 53 is rinsed with pure water for twenty minutes and dried. At this time, the etching amount of the second surface 36 of the semiconductor wafer by the etchant (corresponding to the etching depth D of FIG. 3) is approximately 10 μm.

After the etching of this embodiment, the semiconductor wafer 53 is diced to form the semiconductor chips 32. Measuring the mechanical strength of the semiconductor chips 32, as shown in the above-described FIG. 5B, it was verified that even in the case of the semiconductor chips 32 in which the grinding scratches are formed in a direction perpendicular to the direction of the length of the semiconductor chips, the strength improved to 4.41 N/cm (=450 gf/cm) after etching.

As another embodiment of the invention, after the semiconductor devices are assembled, the second surfaces 36 of the semiconductor chips 32 are irradiated with a laser beam by scanning and the grinding scratches 35 on the second surfaces 36 are removed not by etching but by melting by heat, whereby the mechanical strength of the semiconductor chips 32 can be improved. The inventor of this application has verified that in this case, the mechanical strength of the semiconductor chips 32 increases to approximately 4.41 N/cm (=450 gf/cm). The time when the grinding scratches 35 are removed by melting by laser irradiation is not limited to after assembly but the removal may be performed either for the semiconductor wafer 53 or for the semiconductor chips 32.

As still another embodiment of the invention, the previously described plasma etching may be used for removing the grinding scratches 35 by etching the semiconductor wafer 53.

(Fourth Embodiment)

Figure 6:
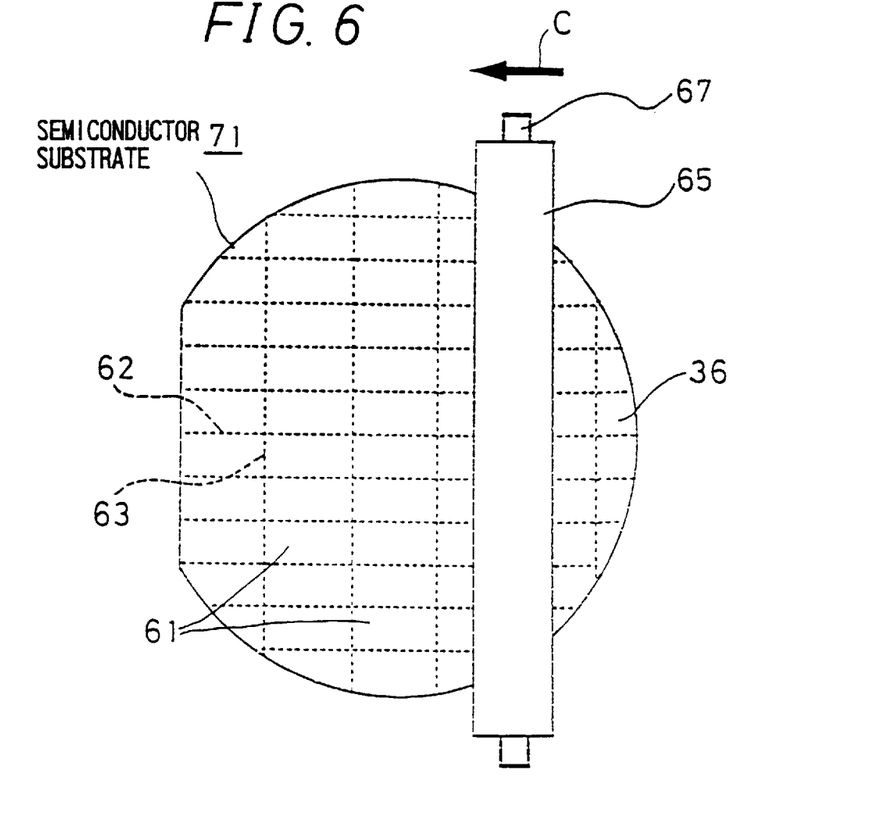
FIG. 6 is a plan view viewed from the side of the second surface 36 showing a semiconductor device manufacturing method according to another embodiment of the invention.
Figure 7:
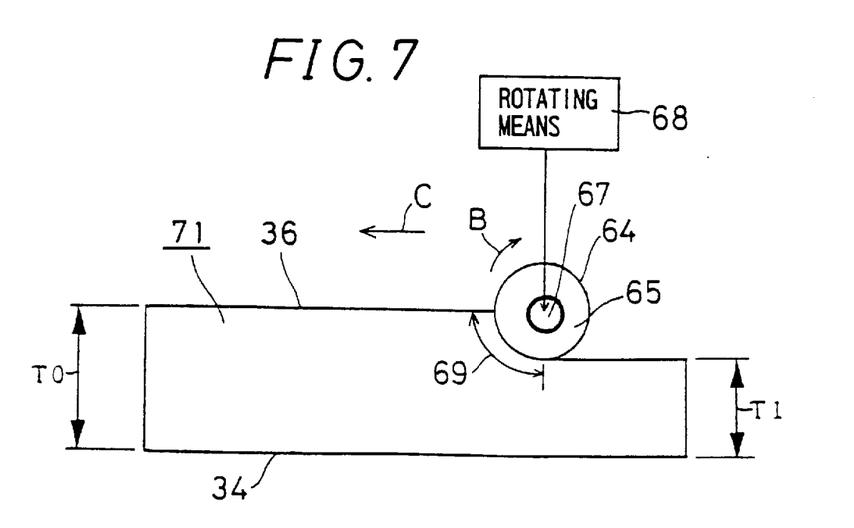
FIG. 7 is a side view of FIG. 6 viewed from below.

FIG. 6 is a plan view viewed from the side of the second surface 36 showing a semiconductor device manufacturing method according to another embodiment of the invention. FIG. 7 is a side view of FIG. 6 viewed from below. Parts and elements corresponding to those of the above-described embodiments are denoted by the same reference numerals. In this embodiment, a wafer-form semiconductor substrate 71 which is a semiconductor device is previously partitioned into a plurality of chip areas 61 each corresponding to a semiconductor chip 32. The areas 61 are defined by a plurality of scribe streaks 62 along the longer sides and a plurality of scribe streaks 63 along the shorter sides perpendicular to the scribe streaks 62. The semiconductor substrate 71 is fixed by a non-illustrated jig so that the second surface 36 which is a surface to be ground faces upward. The second surface 36 is ground with a grinding roller 65 of a right circular cylinder where a grinding layer 64 including abrasive is formed on the periphery thereof.

The grinding roller 65 is coaxially fixed to a rotation shaft 67. The rotation shaft 67 is rotated in the direction of the arrow B around a horizontal rotation axis 66, that is, in a direction where the movement direction of the grinding surface which is the periphery of the grinding roller 65 is opposite to a subsequently-described movement direction C of the grinding roller 65 at a grinding portion 69 where the grinding roller 65 and the second surface 36 are in contact. To the rotation shaft 67, a rotating force in the direction of the arrow B is transmitted by rotating means 68 including a motor and a speed reducer, and by the rotation of the rotation shaft 67, the grinding roller 65 is rotated in the same direction.

The grinding roller 65 thus rotated is moved by non-illustrated moving means in the direction of the arrow C (leftward in FIGS. 6 and 7) at a predetermined constant speed V, so that the second surface 36 is ground parallel to the first surface 34 in a direction of the scribe streaks 62 along the longer sides. At this time, the first surface 34 where semiconductor elements are formed is fixed to a predetermined fixing position while being attached by pressure to a non-illustrated grinding pad on a base. Since the semiconductor substrate 71 is ground while being fixed as described above, the second surface 36 is prevented from being undesirably displaced, so that the second surface 36 can be ground with high precision to be smoothed. As the speed V of the movement of the grinding roller 65 and the rotation shaft 67 in the direction of the arrow C, for example, 2–10 cm/s is selected. The peripheral speed of the grinding surface (that is, the periphery) of the grinding roller 65 is set so that the semiconductor substrate 31 is not adversely affected by frictional heat and is ground as efficiently as possible, and for example, 2–10 cm/s is selected as the peripheral speed.

By such grinding of the second surface 36, the thickness of the semiconductor substrate 71 is reduced from a pre-grinding thickness T0 to a post-grinding thickness T1. When a silicon wafer is used as the base material of the semiconductor substrate 31, the pre-grinding thickness T0 is approximately 600 μm, and the thickness of the semiconductor substrate 31 can be reduced to a post-grinding thickness T1 of approximately 40 to 400 μm.

By setting the grinding direction of the semiconductor substrate 71, that is, the movement direction C of the grinding roller 65 to a direction along the scribe streaks 62 corresponding to the direction of the longer sides of the semiconductor chips 32 as described above, on the second surface 36 of the semiconductor wafer are formed the grinding scratches 35 parallel to the direction of the longer side of each semiconductor chip 32 by grinding (see FIG. 10B). With this, the mechanical strength of all the semiconductor chips 32 for cracking can be improved substantially uniformly, and for a plurality of semiconductor chips cut from one semiconductor wafer, more stable crack strength distribution can be obtained. Moreover, since the mechanical strength for cracking can be significantly improved compared to a case where the grinding scratches 35 are formed substantially parallel to the direction of the short sides of the semiconductor chips 32 (see FIG. 10C), the reliability can be improved and the yield can be improved.

By thus smoothing the grinding scratches 35 like in the above-described embodiments after the semiconductor wafer is reduced in thickness by grinding, the mechanical strength for cracking can be further improved either for the semiconductor chips 32 or for electronic parts comprising packages including the semiconductor chips 32. The smoothing can be performed by use of one of etching, melting and CMP or a combination of some of these processings. By such smoothing, the grinding scratches 35 and cracks coming with the grinding scratches 35 can be removed, eliminated or reduced from the second surface 36, so that the reduction in thickness of semiconductor chips and electronic parts including the semiconductor chips and the improvement in mechanical strength which are contradictory to each other can be simultaneously achieved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor device comprising:

a semiconductor substrate including a semiconductor element formed on a first surface thereof, wherein the semiconductor substrate is reduced in thickness by grinding a second surface thereof, opposite to the first surface, and grinding scratches on the second surface caused by the grinding are removed to smooth the second surface, and wherein a terminal of the semiconductor element is connected to a wiring formed on a carrier tape by inner lead bonding.

2. The semiconductor device of claim 1, wherein the grinding scratches caused by the grinding of the second surface are removed by at least any one of etching, melting and chemical mechanical polish (CMP) surface treatment processes.

3. The semiconductor device of claim 1, wherein the semiconductor substrate having the smoothed second surface has a thickness of 40 to 400 μm.

4. The semiconductor device of claim 1, wherein the semiconductor chip is bonded to the carrier tape by encapsulation with resin.

5. The semiconductor device of claim 4, wherein the semiconductor element is a liquid crystal driving circuit.

6. A semiconductor device comprising:

a semiconductor substrate including at least one semiconductor element formed on a first surface thereof, wherein the semiconductor substrate is reduced in thickness by grinding a second surface thereof opposite to the first surface, and wherein grinding scratches of the second surface of the semiconductor substrate caused by said grinding are removed by melting in order to smooth the second surface of the semiconductor substrate.

7. The semiconductor device of claim 6, wherein said melting comprises laser melting.

8. A semiconductor device comprising:

a semiconductor substrate including a semiconductor element formed on a first surface thereof, wherein the semiconductor substrate is reduced in thickness by grinding a second surface thereof, opposite to the first surface, and grinding scratches on the second surface caused by the grinding are removed to smooth the second surface; and wherein the semiconductor substrate comprises a semiconductor chip formed by dicing, which semiconductor chip includes side surfaces smoothed by removing dicing scratches of the side surfaces caused by the dicing.

9. The semiconductor device of claim 8, wherein grinding scratches caused by grinding of the second surface and dicing scratches caused by the dicing are removed by at least one of etching, melting and chemical mechanical polishing (CPM) surface treatment process(es).

10. The semiconductor device of claim 8, wherein the semiconductor substrate having the smoothed second surface has a thickness of 40 to 400 μm.

11. The semiconductor device of claim 8, wherein a terminal of the semiconductor element is connected to a wiring formed on a carrier tape by inner lead bonding.

12. The semiconductor device of claim 11, wherein the semiconductor chip is bonded to the carrier tape by encapsulation with resin.

13. The semiconductor device of claim 12, wherein the semiconductor element comprises a liquid crystal driving circuit.

* * * * *